United States Patent
Kim et al.

(10) Patent No.: US 6,627,812 B2
(45) Date of Patent: Sep. 30, 2003

(54) APPARATUS FOR CONTAINING ELECTRO-MAGNETIC INTERFERENCE

(75) Inventors: David K.J. Kim, San Jose, CA (US); William W. Ruckman, San Jose, CA (US); Anthony R. Fredericksson, Mountain View, CA (US); Wenjun Chen, Fremont, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 09/939,255

(22) Filed: Aug. 24, 2001

(65) Prior Publication Data

US 2003/0037941 A1 Feb. 27, 2003

(51) Int. Cl.[7] ................................................ H05K 9/00
(52) U.S. Cl. ..................... 174/35 R; 361/816; 361/683; 312/223.2
(58) Field of Search .......................... 174/35 R, 35 MS; 361/800, 816, 818, 683; 312/223.2

(56) References Cited

U.S. PATENT DOCUMENTS 5,774,337 A * 6/1998 Lee et al. .................... 361/725
6,037,541 A * 3/2000 Bartley et al. ................. 174/66

* cited by examiner

Primary Examiner—Hung V. Ngo
(74) Attorney, Agent, or Firm—Meyerton Hood Kivlin Kowert & Goetzel, P.C.; B. Noël Kivlin

(57) ABSTRACT

The present invention discloses methods and apparatus for installing printed circuit boards within an electronic assembly. One embodiment of the present invention is an electro-magnetic interference shielding apparatus for an electronic assembly comprising a shielding partition that separates a first compartment from a second compartment. The apparatus further comprises a top enclosure capable of engaging with the shielding partition to form a plurality of contact seams. The contact seams are capable of restricting electro-magnetic interference from passing through the shielding apparatus. The top enclosure can be capable of tool-free installation and removal to provide access to the interior of the electronic assembly.

20 Claims, 4 Drawing Sheets

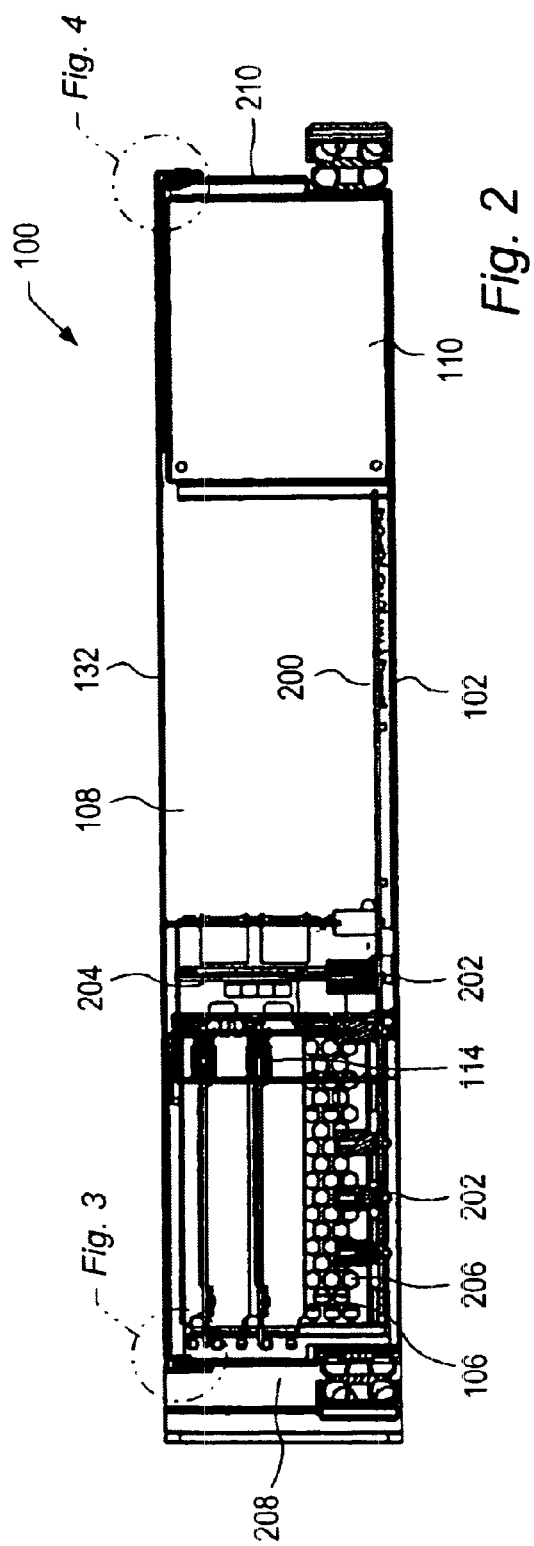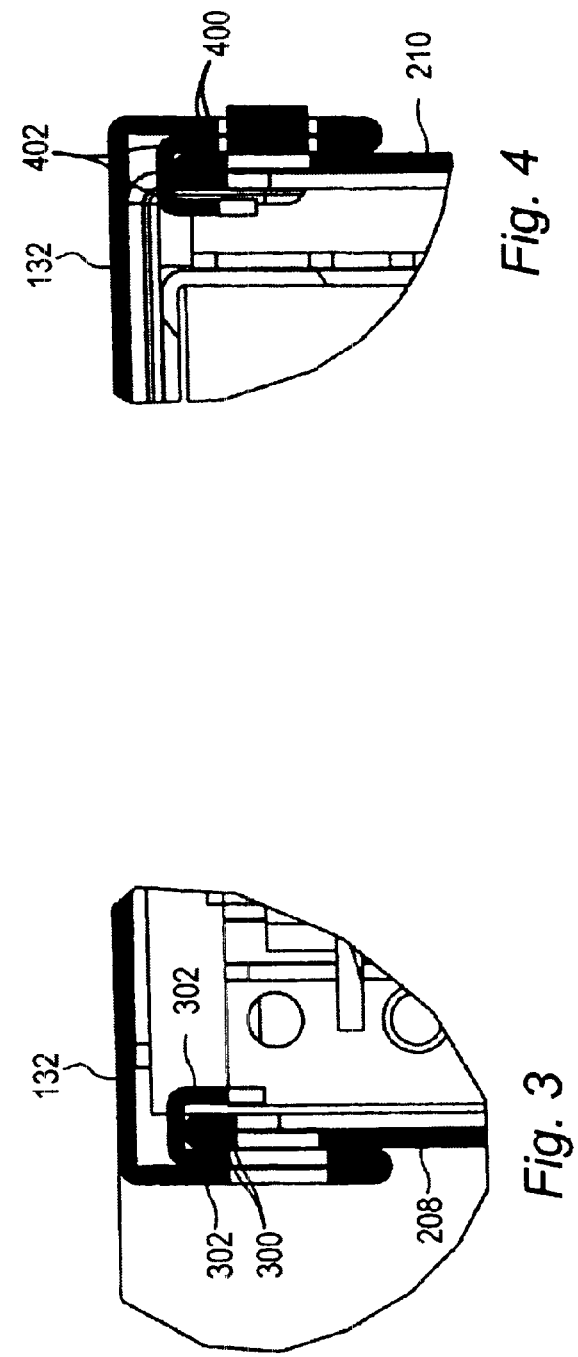

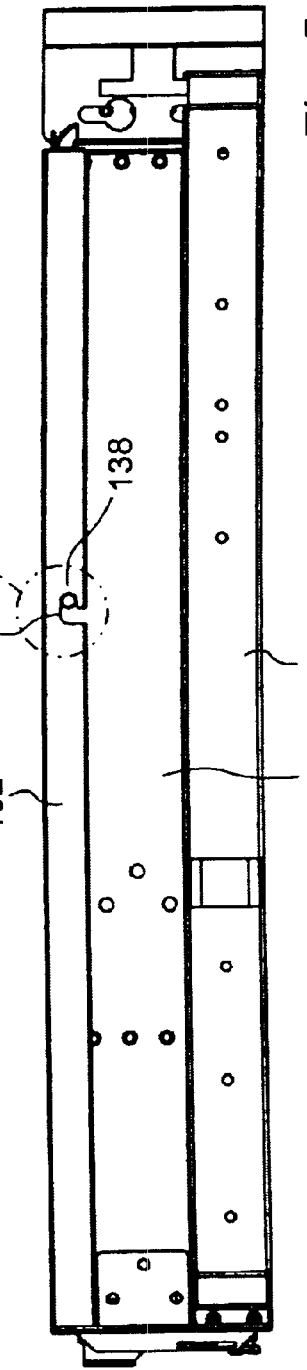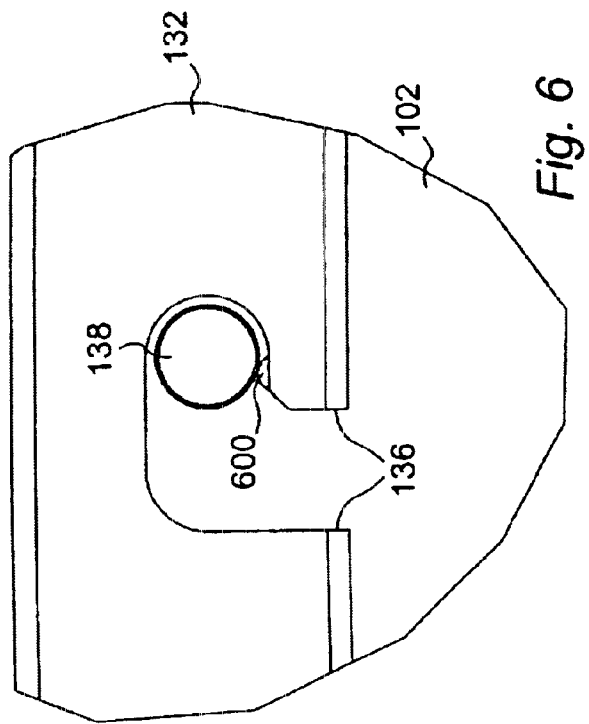

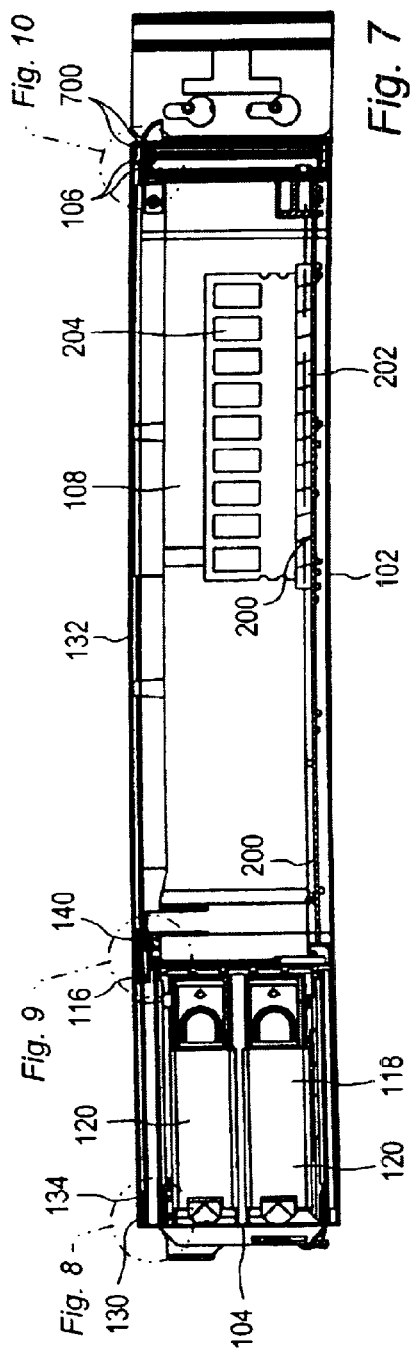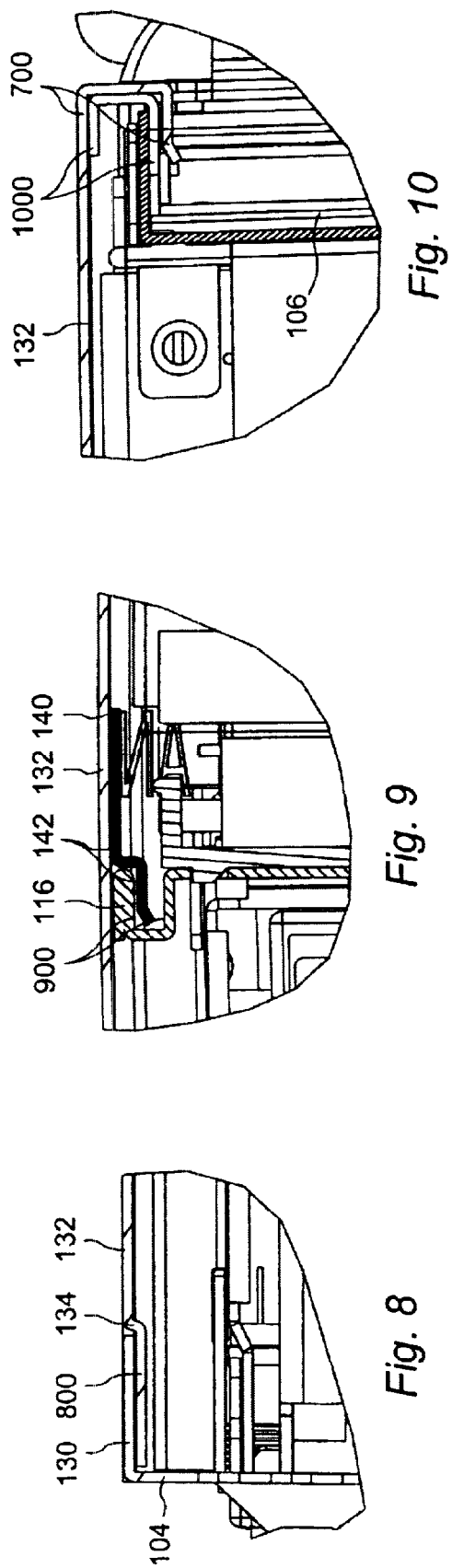

APPARATUS FOR CONTAINING ELECTRO-MAGNETIC INTERFERENCE

BACKGROUND OF THE INVENTION

1. Field of the Invention

This invention relates generally to the shielding of electrical components from Electro-Magnetic Interference (EMI), and, more particularly, to the design and placement of shielding elements within a computer system.

2. Description of Related Art

Computer systems are general-purpose devices that may be modified to perform particular tasks or functions. Generally, computer systems include a motherboard, a power source and other components mounted within a cabinet. The motherboard typically includes a central processing unit (CPU) and a number of connectors or slots in which special purpose printed circuit boards, often referred to as peripheral component interface (PCI) bus cards or "cards", may be inserted. These special purpose cards may be used to add to or enhance the functionality of the computer system. For example, a conventional computer system may have its graphics capability enhanced by the addition of a graphics card. Similarly, the sound-producing capability of the computer system may be enhanced by the addition of a sound card.

The operation of electrical equipment, such as the CPU and printed circuit boards, disk drives, power supplies, and the like, can generate electric and magnetic field forces within the computer assembly. These forces can disrupt the operation of components and are generally referred to as electro-magnetic interference (EMI).

As technology has increased CPU clock speeds and shortened device rise times, the generation of high frequency electro-magnetic interference (EMI) has also increased. Conventional static shielding methods are useful for generally low frequency (<200 Mhz) EMI, but do not provide the isolation needed at the higher frequencies.

Certain sensitive equipment and components need to be shielded from EMI that can adversely affect their operation. Removable peripheral devices such as hard disk drives and compact disk readers are typically located within a removable device compartment of the computer assembly and are electrically connected to the motherboard.

There is a need for improved methods and apparatus to reduce the disruptive effects of electro-magnetic interference (EMI), especially high frequency EMI, within computer assemblies.

SUMMARY OF THE INVENTION

One embodiment of the present invention is an electro-magnetic interference shielding apparatus for an electronic assembly comprising a shielding partition, the shielding partition separating a first compartment from a second compartment. The apparatus further comprises a top enclosure capable of engaging with the shielding partition to form a plurality of contact seams. The contact seams are capable of restricting electro-magnetic interference from passing through the shielding apparatus. The shielding partition can comprise apertures that are sized sufficiently small to restrict the passage of relatively high frequency electro-magnetic interference emissions. The top enclosure can be capable of tool-free installation and removal.

Another embodiment of the invention is a method for containing electro-magnetic interference emissions within a computer assembly. The method comprises separating a motherboard compartment from the rest of the computer assembly by inserting a shielding partition within an assembly housing. A shield assembly around the motherboard compartment is created by attaching a top enclosure to the housing and to the shielding partition, thereby creating a plurality of tortuous paths. The tortuous paths restrict the passage of electro-magnetic interference emissions through the shield assembly.

BRIEF DESCRIPTION OF THE DRAWINGS

The invention may be understood by reference to the following description, taken in conjunction with the accompanying drawings, in which the leftmost significant digit(s) in the reference numerals denote(s) the first figure in which the respective reference numerals appear, and in which:

FIG. 2 is a cross-sectional view of the electronic assembly comprising an embodiment of the present invention;

FIG. 3 is an expanded view of a portion the embodiment shown in FIG. 2;

FIG. 4 is an expanded view of a portion the embodiment shown in FIG. 2;

FIG. 5 is a side view of the electronic assembly comprising an embodiment of the present invention;

FIG. 6 is an expanded view of a portion the embodiment shown in FIG. 5;

FIG. 7 is a cross-sectional view of the electronic assembly comprising an embodiment of the present invention;

FIG. 8 is an expanded view of a portion the embodiment shown in FIG. 7;

FIG. 9 is an expanded view of a portion the embodiment shown in FIG. 7; and FIG. 10 is an expanded view of a portion the embodiment shown in FIG. 7.

Figure 1:
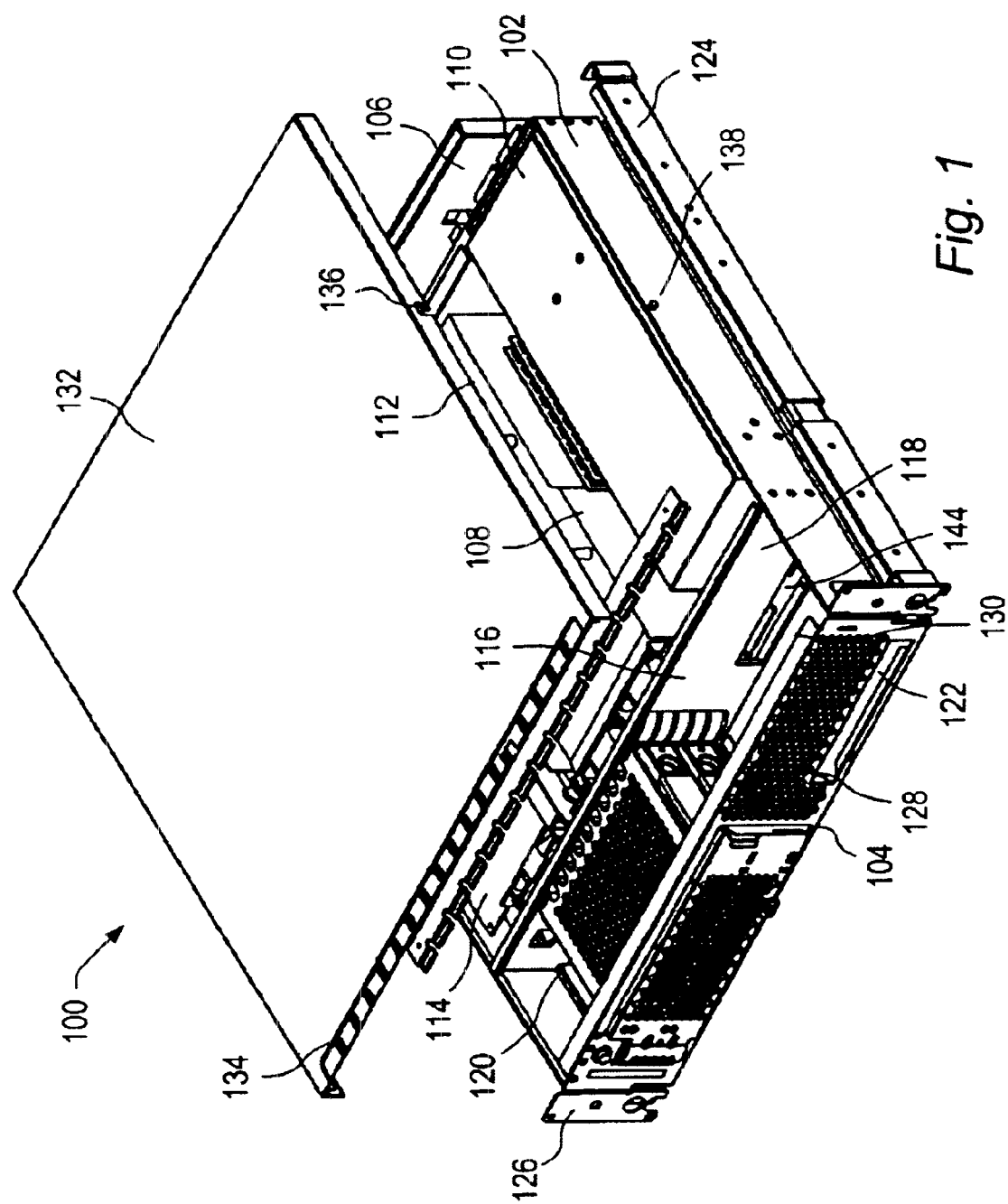
FIG. 1 shows a partially exploded top perspective view of the interior of an electronic assembly comprising an embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but, on the contrary, the intention is to cover all modifications, equivalents, and alternatives falling within the scope of the invention as defined by the appended claims.

DESCRIPTION OF ILLUSTRATIVE EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

It is well known that electrical components and the housing chassis can be excited by electric-field and magnetic-field coupling with printed circuit boards. Heatsinks and reference planes can capacitively couple with electrical circuits and the chassis of an electrical assembly. Large currents that are conducted through bus connectors, traces, and cables can create magnetic fields that can couple with and excite the chassis, resulting in electrical currents conducted on the interior of the chassis surface. If a current is forced to pass around a slot that is located in its path, electric and magnetic-fields will be generated within the slot. The slot can then function as a magnetic dipole antenna and can serve as an effective electro-magnetic interference (EMI) antenna at frequencies in which the slot length is a multiple of a quarter wavelength. This effect will also occur when currents are forced around seams, apertures and other similar obstructions. In the present application, the term "tortuous path" can be used to indicate an electrical current pathway that involves twists, bends, turns or other imposed restrictions.

The present invention presents apparatus and methods that utilize this phenomenon to form a shield that restricts EMI emissions from passing through the shield to protected electronic components. The shield at least partially contains the EMI emissions within the motherboard compartment of the computer assembly.

Referring to the attached drawings, FIG. 1 is a partially exploded perspective view of an electronic assembly 100 comprising a chassis 102 with a front enclosure 104 and a rear enclosure 106. Within this application the term "computer assembly" can be used to refer to electronic assemblies, electronic devices and other multi-component systems in which the present invention can be used. A motherboard compartment 108 is disposed within the chassis 102 and comprises a power supply 110, a CPU cooling compartment 112, and a PCI card riser assembly compartment 114. A middle frame element 116 separates the motherboard compartment 108 from a removable device compartment 118. Within the removable device compartment 118 is shown two hard disk drives 120 and an open port 122 for another device, such as a compact disk—read only memory (CD-ROM). The chassis 102 is attached to a sliding frame 124 that can move between a retracted position and an extended position. The sliding frame 124 enables the electronic assembly 100 to be extended forward to allow access to the components located in the interior of the assembly 100. A retaining bracket 126 connected to the chassis 102 enables the electronic assembly 100 to be secured with the sliding frame 124 to an external frame (not shown), when the electronic assembly 100 is in its retracted position.

The middle frame element 116 that separates the motherboard compartment 108 from the removable device compartment 118 can comprise an EMI barrier and can be referred to as a shielding partition. The middle frame element 116 can also contain apertures that are sized sufficiently small to restrict the passage of relatively high frequency EMI emissions. These apertures can also serve to enable airflow through the shielding partition 116 to cool heat generating components within the motherboard compartment 108. The phrase "relatively high frequency EMI emissions" within the present application refers to emissions with frequencies in excess of about 200 Mhz. In the illustrated embodiment, the middle frame element 116 contains an opening 144 capable of housing an electrical component.

The front enclosure 104 comprises apertures 128 to allow airflow to pass through the electronic assembly 100 to facilitate the cooling of heat generating components. The front enclosure 104 also comprises an upper ledge 130 that protrudes inward towards the electronic assembly 100.

A top enclosure 132 comprises a front edge 134 that can fit under the upper ledge 130 of the front enclosure 104. A guide slot 136 on the top enclosure 132 is designed to engage with a guide pin 138 on the chassis 102. A shield element 140 is attached to the top enclosure 132. The shield element 140 can comprise a plurality of tabbed protrusions 142 that engage with the middle frame element 116 when the top enclosure 132 is installed. The engagement of the protrusions 142 of the shield element 140 with the middle frame element 116 creates a plurality of contact seams and a tortuous path for an electrical current. These contact seams are capable of restricting electro-magnetic interference from passing through the top enclosure 132 and the middle frame element 116, thus shielding the removable device compartment 118 from EMI emissions.

FIG. 2 is a cross-sectional front view of the electronic assembly 100 showing the placement of the top enclosure 132 on the chassis 102, in relation to the motherboard compartment 108 and the power supply 110. Within the motherboard compartment 108, the motherboard 200 is shown with conventional PCI-type edge connectors 202 mounted thereon. A printed circuit board 204, along with the PCI riser card assembly 114 is attached to the motherboard 200. Apertures 206 located within the rear enclosure 106 allow airflow to pass through the motherboard compartment 108 to facilitate the cooling of heat generating components. The chassis 102 comprises a left wall 208 and a right wall 210 that engage with the top enclosure 132.

FIG. 3 is an expanded view of a portion the embodiment shown in FIG. 2. The left wall 208 of the chassis 102 comprises a folded end 300. A left edge of the top enclosure 132 comprises a folded channel 302 that fits over the folded end 300 of the chassis left wall 208. The engagement the folded end 300 of the left wall 208 of the chassis 102 and the folded channel 302 of the top enclosure 132 creates a contact seam and a tortuous path for an electrical current. This contact seam is capable of restricting electro-magnetic interference from passing through the top enclosure 132 and the chassis 102.

FIG. 4 is an expanded view of a portion the embodiment shown in FIG. 2. The right wall 210 of the chassis 102 comprises a folded end 400. The right edge of the top enclosure 132 comprises a folded channel 402 that fits over the folded end 400 of the chassis right wall 210. The engagement of the folded end 400 of the right wall 210 of the chassis 102 and the folded channel 402 of the top enclosure 132 creates a contact seam and a tortuous path for an electrical current. This contact seam is capable of restricting electro-magnetic interference from passing through the top enclosure 132 and the chassis 102.

FIG. 5 is a side view of the electronic assembly 100 showing the top enclosure 132 located on the chassis 102 in relation to the sliding frame 124. The top enclosure 132 is attached to the chassis 102 by the guide pin 138 disposed within the guide slot 136. The top enclosure 132 may be removed from the electronic assembly 100 by sliding the top enclosure 132 toward the rear (to the right in FIG. 5) of the electronic assembly 100. In this displaced position, the guide pin 138 is free from engagement with the guide slot 136 such that the top enclosure 132 may be lifted vertically off of the electronic assembly 100.

FIG. 6 is an expanded view of a portion the embodiment shown in FIG. 5. The guide pin 138 that protrudes from the chassis 102 is shown within the guide slot 136 located in the top enclosure 132. A protrusion 600 is located on a lower surface within the guide slot 136, and operates to assist with retaining the top enclosure 132 within the proper position in relation to the chassis 102. The protrusion 600 also acts to compress the top enclosure 132 downward onto the chassis 102, thus creating a tighter fit between the top enclosure 132 and the chassis 102 and improving the EMI shielding characteristics of the assembly. That is, the protrusion 600 engages a lower surface of the guide pin 138, deflecting the top enclosure 132 downward into more substantial contact with the chassis 102.

FIG. 7 is a cross-sectional side view of the electronic assembly 100 showing the attachment of the top enclosure 132 to the front enclosure 104 and the rear enclosure 106. The top enclosure 132 is shown in relation to the removable device compartment 118, middle frame element 116 and the motherboard compartment 108. Two hard drive disks 120 are shown within the removable device compartment 118. The motherboard 200 has a conventional PCI-type edge connector 202 that has a printed circuit board 204 inserted therein. The front edge 134 of the top enclosure 132 is engaged under the upper ledge 130 of the front enclosure 104. The shield element 140 is engaged with the middle frame element 116 and a back channel 700 of the top enclosure 132 is engaged with the rear enclosure 106.

FIG. 8 is an expanded view of a portion the embodiment shown in FIG. 7 illustrating the engagement of the front edge 134 of the top enclosure 132 with the upper ledge 130 of the front enclosure 104. The upper ledge 130 serves to retain the top enclosure 132 in engagement with the front enclosure 104. The front edge 134 includes a lip 800 that is displaced downwardly, extending below the upper ledge 130 of the front enclosure 104. In the illustrated embodiment, the lip 800 is integrally formed with the top enclosure 132; however, those skilled in the art will appreciate that the lip 800 may be separately formed and joined with the top enclosure 132 by a variety of fastening operations, such as screwing, riveting, welding, gluing, or the like.

FIG. 9 is an expanded view of a portion the embodiment shown in FIG. 7 illustrating the engagement of the shield element 140 with the middle frame element 116. The middle frame element 116 comprises a channel 900 at its upper end that is capable of receiving the tabbed protrusions 142 of the shield element 140. The top of the channel 900 serves as a support for the top enclosure 132, while the engagement of the tabbed protrusions 142 within the channel 900 serves to retain the shield element 140, and therefore the attached top enclosure 132, in contact with the middle frame element 116. The engagement of the shield element 140 with the channel 900 of the middle frame element 116 creates a contact seam and a tortuous path for an electrical current. This contact seam is capable of restricting electro-magnetic interference from passing through the top enclosure 132 and the middle frame element 116.

FIG. 10 is an expanded view of a portion the embodiment shown in FIG. 7 illustrating the engagement of the top enclosure 132 with the rear enclosure 106. The rear enclosure 106 comprises a U-shaped channel 1000 at its upper end that protrudes outward from the rear enclosure 106 and is sized to fit within the back channel 700 of the top enclosure 132. The engagement of the back channel 700 around the channel 1000 provides a means of retaining and supporting the top enclosure 132, while providing contact between the top enclosure 132 and the rear enclosure 106. The engagement of the back channel 700 with the channel 1000 of the rear enclosure 106 creates a contact seam and a tortuous path for an electrical current. This contact seam is capable of restricting electro-magnetic interference from passing through the top enclosure 132 and the rear enclosure 106.

As can be seen from FIGS. 1–10 and the above detailed description, the present invention enables a tool-free installation and removal of the top enclosure 132, thereby providing easy access to the interior of the electronic assembly 100. When the top enclosure 132 is assembled with the chassis 102, middle frame element 116, and rear enclosure 106 as described above, the slots, seams, apertures and other induced current obstructions that are contained within these elements provide a shield around the motherboard compartment 108, thereby restricting EMI from passing through the shield to the electronic components outside of the motherboard compartment.

The phrase "tool-free installation and removal" means that the item can be engaged and disengaged without the use of a tool, for example, a screwdriver or a wrench. The human hand of a person of ordinary dexterity can perform the installation and removal. Examples of connectors and retaining elements that can provide tool-free installation and removal include flexible snaps and tabs and spring loaded retaining rings.

To install the top enclosure 132 onto the electronic assembly 100, lower the top enclosure 132 until the folded channels 302, 402 of the top enclosure 132 sides contact the folded ends 300, 400 of the chassis 102 sides and the guide pin 138 enters the guide slot 136. The top enclosure 132 can then be moved towards the front enclosure 104 until the front edge 134 of the top enclosure 132 engages under the upper ledge 130 of the front enclosure 104. This forward movement will also engage the tabbed protrusions 142 of the shield element 140 with the channel 900 of the middle frame element 116, will engage the back channel 700 of the top enclosure 132 with the channel 1000 of the rear enclosure 106, and will locate the guide pin 138 within the guide slot 136 whereby the protrusion 600 in the guide slot 136 urges the top enclosure 132 downward and secures the top enclosure 132 to the chassis 102.

It should be appreciated that while the embodiments described herein make specific reference to PCI cards, connectors and riser assemblies, those skilled in the art will recognize that the present invention has wide application. For example, the present invention may be employed in electronic assemblies having other bus configurations, such as Industry Standard Architecture (ISA), Accelerated Graphics Port (AGP), or the like.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. An electro-magnetic interference shielding apparatus for an electronic assembly, comprising:

a shielding partition, the shielding partition separating a first compartment from a second compartment; and a top enclosure capable of engaging with the shielding partition, wherein the top enclosure comprises a shield element capable of engaging with the shielding partition to form a plurality of contact seams; and wherein the shielding partition comprises apertures that are sized sufficiently small to restrict the passage of relatively high frequency electro-magnetic interference emissions, and wherein the shield element comprises a plurality of tabbed protrusions, the tabbed protrusions capable of engaging with the shielding partition to form a plurality of contact seams.

2. The shielding apparatus of claim 1, wherein the top enclosure is capable of tool-free installation and removal.

3. The shielding apparatus of claim 1, further comprising:
an electronic assembly housing, the housing comprising a first wall and a second wall, the first and second walls comprising top edges that are capable of engaging with a first and second channel on the top enclosure;
wherein the engagement of the first wall and the first channel creates a first contact seam and the engagement of the second wall and the second channel creates a second contact seam;
wherein the first and second contact seams are capable of restricting electro-magnetic interference from passing through the shielding apparatus.

4. The shielding apparatus of claim 3, further comprising:
a rear enclosure capable of attachment to the electronic assembly housing and comprising a channel, the rear enclosure channel capable of engaging with a top enclosure rear channel creating a rear contact seam;
wherein the rear contact seam is capable of restricting electro-magnetic interference from passing through the shielding apparatus.

5. The shielding apparatus of claim 3, wherein the first and second housing walls comprise guide pins that are capable of engaging with guide slots in the top enclosure.

6. The shielding apparatus of claim 5, wherein the guide slots in the top enclosure comprise a protrusion that is capable of retaining the top enclosure engaged with the housing walls and is capable of compressing the top enclosure into a tighter engagement with the housing walls.

7. The shielding apparatus of claim 3, wherein the top edges of the first and second housing walls comprise folded edges, thereby creating a tortuous path.

8. The shielding apparatus of claim 3, wherein the first and second channels on the top enclosure comprise folded channels, thereby creating a tortuous path.

9. An electronic assembly, comprising:
a housing;
a shielding partition attached to the housing, the shielding partition defining a motherboard compartment within the housing; and
a top enclosure capable of contacting and engaging with the shielding partition and the housing, thereby creating a plurality of contact seams and tortuous paths and forming a shielding assembly enclosing the motherboard compartment;
wherein the tortuous paths restrict the passage of electro-magnetic interference emissions through the shielding apparatus, and wherein the top enclosure comprises guide slots that are capable of engaging with guide pins protruding from the housing.

10. The electronic assembly of claim 9, wherein the top enclosure is capable of tool-less installation and removal.

11. The electronic assembly of claim 9, wherein the shielding partition comprises apertures that are sized sufficiently small to restrict the passage of relatively high frequency electro-magnetic interference emissions.

12. The electronic assembly of claim 9, wherein the guide slots comprise a protrusion that releasably anchors the guide pin within the guide slot.

13. The electronic assembly of claim 12, wherein the protrusion is capable of retaining the top enclosure engaged with the housing and is capable of urging the top enclosure into a tighter engagement with the housing walls.

14. An electronic assembly, comprising:
a motherboard compartment;
a removable device compartment; and
an electro-magnetic interference shielding apparatus that includes a housing, a top enclosure, a rear enclosure, and a shielding partition separating the motherboard compartment and the removable device compartment, wherein the shielding partition comprises apertures that are sized sufficiently small to restrict the passage of relatively high frequency electro-magnetic interference emissions from the motherboard compartment to the removable device compartment, and wherein the housing comprises guide pins that are capable of engaging with guide slots within the top enclosure, thereby retaining the top enclosure engaged to the housing.

15. The electronic assembly of claim 14, wherein the top enclosure is capable of tool-less installation and removal with the rest of the electro-magnetic interference shielding apparatus.

16. The electronic assembly of claim 14, wherein the shielding partition and the top enclosure are capable of contact with each other, thereby creating a plurality of contact seams, the plurality of contact seams capable of restricting the passage of electro-magnetic interference emissions from the motherboard compartment.

17. The electronic assembly of claim 14, wherein the housing and the top enclosure are capable of contact with each other, thereby creating contact seams, the contact seams capable of restricting the passage of electro-magnetic interference emissions from the motherboard compartment.

18. The electronic assembly of claim 14, wherein the housing and the top enclosure are capable of contact with each other, thereby creating a tortuous path capable of restricting the passage of electro-magnetic interference emissions from the motherboard compartment.

19. The electronic assembly of claim 14, wherein the rear enclosure and the top enclosure are capable of contact with each other, thereby creating a plurality of contact seams, the plurality of contact seams capable of restricting the passage of electro-magnetic interference emissions from the motherboard compartment.

20. The electronic assembly of claim 14, wherein the rear enclosure and the top enclosure are capable of contact with each other, thereby creating a tortuous path capable of restricting the passage of electro-magnetic interference emissions from the motherboard compartment.

* * * * *